United States Patent
Tuen et al.

(10) Patent No.: US 7,928,327 B2
(45) Date of Patent: Apr. 19, 2011

(54) SHIELDING DEVICE

(75) Inventors: Lung-Fai Tuen, Taipei Hsien (TW); Andy C.H. Chang, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 123 days.

(21) Appl. No.: 12/193,045

(22) Filed: Aug. 18, 2008

(65) Prior Publication Data

US 2009/0114437 A1   May 7, 2009

(30) Foreign Application Priority Data

Nov. 7, 2007   (TW) ................................ 96142029 A

(51) Int. Cl.
*H05K 9/00* (2006.01)
(52) U.S. Cl. ...................... 174/386; 174/391; 174/394
(58) Field of Classification Search ............... 174/353, 174/377, 386, 391, 394; 361/816, 818; 206/720, 206/721
See application file for complete search history.

(56) References Cited

U.S. PATENT DOCUMENTS

| 5,180,615 | A | 1/1993 | Havens |
| 5,739,463 | A * | 4/1998 | Diaz et al. ............. 174/378 |
| 6,784,363 | B2 * | 8/2004 | Jones ................... 174/351 |
| 2006/0272857 | A1 * | 12/2006 | Arnold ................ 174/377 |

FOREIGN PATENT DOCUMENTS

| CN | 1025837 | C | 9/1994 |
| CN | 1149378 | A | 5/1997 |
| CN | 1868737 | A | 11/2006 |
| CN | 101005756 | A | 7/2007 |
| TW | M292468 | | 6/2006 |
| TW | I279185 | | 4/2007 |
| WO | 9528072 | | 10/1995 |

* cited by examiner

*Primary Examiner* — Hung V Ngo
(74) *Attorney, Agent, or Firm* — Winston Hsu; Scott Margo

(57) ABSTRACT

A shielding device configured to provide EMI and ESD protection includes an anti-ESD layer, a conductive layer, and an EMI blocking layer attached to each other in sequence. In addition, a supporting layer can be optionally attached to the EMI blocking layer to increase the strength of the shielding device.

12 Claims, 10 Drawing Sheets

SHIELDING DEVICE

BACKGROUND OF THE INVENTION

1. Field of the Invention

The present invention relates to a shielding device applied to electronic devices, and more particularly, to a shielding device that is anti-ESD (electronic discharge) and EMI (electromagnetic interference) blocking.

2. Description of the Prior Art

Electrostatic discharge (ESD) is the sudden and momentary electric current that flows between two objects at different electrical potentials.

One of the causes of ESD events is static electricity. Static electricity is often generated through tribocharging, the separation of electric charges that occurs when two materials are brought into contact and then separated.

Electromagnetic interference (EMI) is a disturbance caused in a radio receiver or other electrical circuit by electromagnetic radiation emitted from an external source. The disturbance after coupling may form common-mode noise that interrupts, obstructs, or otherwise degrades or limits the effective performance of the circuit. The source may be a microprocessor, electrical circuit, ESD or power sources.

A conventional anti-ESD method is usually to set up protection circuits around input/output sites, or to conduct the charges to ground. A conventional method of EMI-blocking is usually to use an EMI shielding material such as springs or a gasket. These conventional methods of preventing ESD and EMI, however, take up space and are expensive.

SUMMARY OF THE INVENTION

According to the claimed invention, an anti-ESD and EMI blocking shielding device comprises: an anti-ESD layer comprising an anti-static agent and a first shaping material, a conductive layer comprising a first conductive material, and a second shaping material; and an EMI blocking layer comprising a high permeability material, a third shaping material and a second conductive material, wherein the anti-ESD layer and the conductive layer are laminated to each other tightly and the conductive layer and the EMI blocking layer are laminated to each other tightly.

According to another preferred embodiment of the claimed invention, an anti-ESD shielding device comprises: an anti-ESD layer comprising an anti-static agent and a first shaping material; and a conductive layer comprising a conductive material, and a second shaping material, wherein the anti-ESD layer and the conductive layer are laminated to each other tightly.

According to another preferred embodiment of the claimed invention, an EMI blocking shielding device comprises: a conductive layer comprising a first conductive material, and a first shaping material; and an EMI blocking layer comprising a high permeability material, a second shaping material and a second conductive material, wherein the conductive layer and the EMI blocking layer are laminated to each other tightly.

According to another preferred embodiment of the claimed invention, a method of making an anti-ESD and EMI blocking shielding device comprises: mixing an anti-static agent, a first ferromagnetic material, a first solvent and a first shaping material in sequence to form an anti-ESD layer, mixing a first conductive material, a second ferromagnetic material, a first dispersant, a second solvent and a second shaping material in sequence to form a conductive layer, mixing a high permeability material, a second conductive material, a second dispersant, a third solvent and a third shaping material in sequence to form an EMI blocking layer, and sandwiching the conductive layer between the anti-ESD layer and the EMI blocking layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
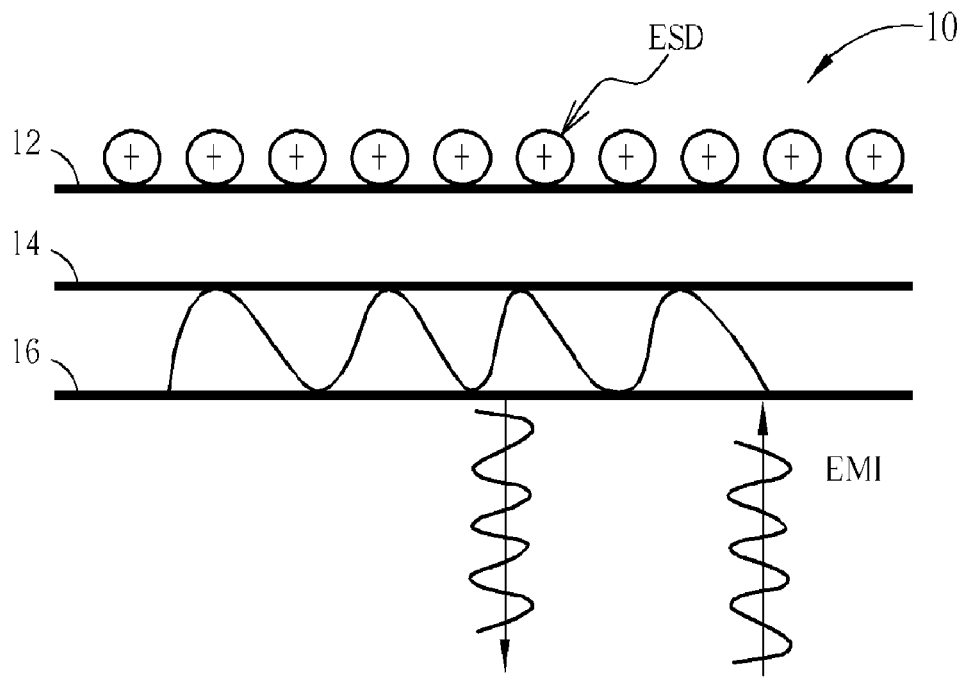
FIG. 1 shows an anti-ESD and EMI blocking shielding device according to the present invention.

The anti-ESD and EMI blocking shielding device according to the present invention is constituted of three layers—the anti-ESD layer, the conductive layer, and the EMI blocking layer. The sequence of making the three layers can be changed, for example, the anti-ESD layer can be made first, thereafter the conductive layer is made, and finally the EMI blocking layer is made; or the conductive layer can be made first, thereafter the anti-ESD layer is made, and finally the EMI blocking layer is made; or other combinations. The following embodiment will take the anti-ESD layer, the conductive layer, the EMI-blocking layer as the fabricating sequence.

The method of making an anti-ESD layer is described as follows. An anti-static agent and a first ferromagnetic material, such as iron powders are mixed together. Next, a first solvent such as methyl-ethyl ketone is mixed with the anti-static agent and the first ferromagnetic material by a mixing machine. Finally, a shaping material such as polyurethane (PU) is added into the mixture of the anti-static agent, the first ferromagnetic material and the first solvent. Then the mixture of the anti-static agent, the first ferromagnetic material, the first solvent and the shaping material is vacuumed by a vacuumer. After that, the vacuumed mixture is put onto the releasing paper to make into a film. At this point, the anti-ESD layer is finished.

Common anti-static agents are based on long-chain aliphatic amines and amides, quaternary ammonium salts, esters of phosphoric acid, polyethylene glycol esters, or organic salts of sulfonic acids. Any anti-static agent that has the function of anti-ESD can be used in the present invention. The shaping material is not limited to PU, and other shaping materials can be used including polyvinyl chloride (PVC), polystyrene (PS), polyethylene (PE), and nylon. Furthermore, the first solvent is not limited to methyl-ethyl ketone. Any solvent that can uniformly mix the anti-ESD agent and the shaping material can be used. According to the present invention, the anti-static agent is 10.3 wt % and the first ferromagnetic material is 5.1 wt %. The percentage of the anti-static agent and the first ferromagnetic material can be changed according to different requirements, however.

The method of making a conductive layer is described as follows. A first conductive material such as conductive carbon black is mixed with a first dispersant and a second ferromagnetic material, such as iron powders in up, down, left and right directions by a premixing machine. The bottom of the premixing machine has a magnetic material to attract the second ferromagnetic material. In this way, the first conductive material can be uniformly dispersed into particles. In addition, the premixing machine has a rotation rate of 30000 r.p.s and has a rotation time of 10 minutes during the premixing process. According to different requirements, the rotation rate and the rotation time can be changed.

After the pre-mixing process, a second solvent such as methyl-ethyl ketone is uniformly mixed into the mixture of the first conductive material, the second ferromagnetic material and the first dispersant. Then a second shaping material such as polyurethane is uniformly mixed into the mixture of the first conductive material, the second ferromagnetic material, the first dispersant and the second solvent. After that, the mixture is vacuumed by a vacuumer. Then, the vacuumed mixture is put onto the releasing paper to be made into a film. At this point, the conductive layer is finished.

The conductive carbon black mentioned above can be alternated with carbon nanotubes (CNTs), or any material that can make the resistance of the conductive layer become 0.07Ω). In the same way, the second solvent is not limited to methyl-ethyl ketone. Any solvent that can uniformly mix the first conductive material, the first dispersant, the second ferromagnetic material, and the second shaping material can be used. The second shaping material is not limited to PU, and other shaping materials can be used including PVC, PS, PE, nylon. According to the present invention, the first conductive material is 6.3 wt %, the second ferromagnetic material is 4.2 wt %, and the first dispersant is 2.1 wt %. The percentage of the first conductive material, the second ferromagnetic material and the first dispersant can be changed according to different requirements, however.

The method of making the EMI blocking layer is described as follows. First, a high permeability material and a second conductive material such as copper, iron, or aluminum are mixed with a second dispersant. Next, a third solvent such as methyl-ethyl ketone is mixed into the mixture of the high permeability material and the second conductive material by a mixing machine. After that, a third shaping material such as PU is mixed into the mixture. Then, the mixture of the high permeability material, the second conductive material, the second dispersant, the third solvent and the third shaping material is vacuumed by a vacuumer. Next, the vacuumed mixture is put onto the releasing paper to make into a film. At this point, the EMI blocking layer is finished.

The high permeability material mentioned above includes a material having a permeability greater than 1500 Wb/At·m, for example, MgZn ferrite powder. The second conductive material is not limited to copper, iron, or aluminum. Any material that can have resonant frequency points with the high permeability material can be utilized. According to the preferred embodiment of the present invention, adding the second conductive material can greatly increase the EMI blocking effect. In the same way, the third solvent is not limited to methyl-ethyl ketone. Any solvent that can uniformly mix the high permeability material, the second dispersant, the second conductive material, and the third shaping material can be used. The third shaping material is not limited to PU, and other shaping materials can be used including PVC, PS, PE, nylon. According to the present invention, the high permeability material is 20 wt %, the second conductive material is 6.6 wt %, and the second dispersant is 2.6 wt %. The percentage mentioned above can be changed according to different requirements, however.

Now, the anti-ESD layer, the conductive layer, and the EMI blocking layer are finished. The lamination sequence can be random, for example, taking the EMI blocking layer as bottom layer, the conductive layer as the middle layer, and the anti-ESD layer as the top layer. In this way, the anti-ESD and EMI blocking shielding device according to the present invention is formed. In addition, a supporting layer can be laminated to the anti-ESD and EMI blocking shielding device optionally to increase the tenacious of the anti-ESD and EMI blocking shielding device. The supporting layer may be formed by the first shaping material, the second shaping material or the third shaping material.

Compared to the conventional method of preventing the ESD and EMI, the anti-ESD and EMI blocking shielding device according to the present invention can be easily positioned at the source of the noise or the ESD point to prevent the ESD and EMI. Furthermore, the anti-ESD and EMI blocking shielding device provided in the present invention occupies less space and is less expensive than conventional methods. In addition, the method of making the anti-ESD and EMI blocking shielding device according to the present invention provides more reliable products and the productivity can be increased.

FIG. 1 shows an anti-ESD and EMI blocking shielding device according to the present invention. As shown in FIG. 1, an anti-ESD and EMI blocking shielding device 10 includes an anti-ESD layer 12, a conductive layer 14, and an EMI blocking layer 16 laminated in sequence. The anti-ESD layer 12 includes an anti-static agent and a first shaping material such as PU. The conductive layer 14 includes a first conductive material such as conductive carbon black, CNTs or any material that can make the resistance of the conductive layer become 0.07Ω). The conductive layer 14 further includes a ferromagnetic material such as iron powders and a second shaping material such as PU. The EMI blocking layer 16 includes a high permeability material, a second conductive material, and a third shaping material such as PU. The high permeability material mentioned above includes a material having permeability greater than 1500 Wb/At·m, for example, MgZn ferrite powder. The second conductive material includes copper, iron, aluminum or other materials that can have resonant frequency points with the high permeability material.

Permeability is the degree of magnetization of a material that responds linearly to an applied magnetic field. Materials with higher permeability form a magnetic field more easily.

Reluctance can be thought of as the ability to resist forming a magnetic field. The higher the permeability, the lower the resistance, therefore, the magnetic field can be formed more easily. Because of the magnetic field, the EMI wave may resonate between the conductive layer 16 and the EMI blocking layer 14, and destructive interference will occur. In addition, because the EMI wave vibrates between materials with different dielectric constants, the wave is not continuous. The speed of the wave will slow down and eventually decay. The function of the high dielectric constant material such as the second conductive material is to act as a wave absorber. By uniformly dispersing the second conductive material, the EMI wave can be effectively absorbed. Therefore, a permeability material and a high dielectric constant material are used in the present invention.

Due to the anti-static agent, the anti-ESD layer 12 can make the surface of the material itself slightly conductive, either by being conductive, or by absorbing moisture from the air, therefore reducing static electricity. The conductive layer 14 can conduct the static electricity away, therefore, the conductive layer 14 is anti ESD also. The EMI blocking layer 16 can make the EMI wave resonate repeatedly, and the EMI wave will propagate along a longer route so the EMI wave will be decayed. According to a preferred embodiment of the present invention, the anti-ESD and EMI blocking shielding device can sustain at least +/−15 KV electric discharge.

Figure 2:
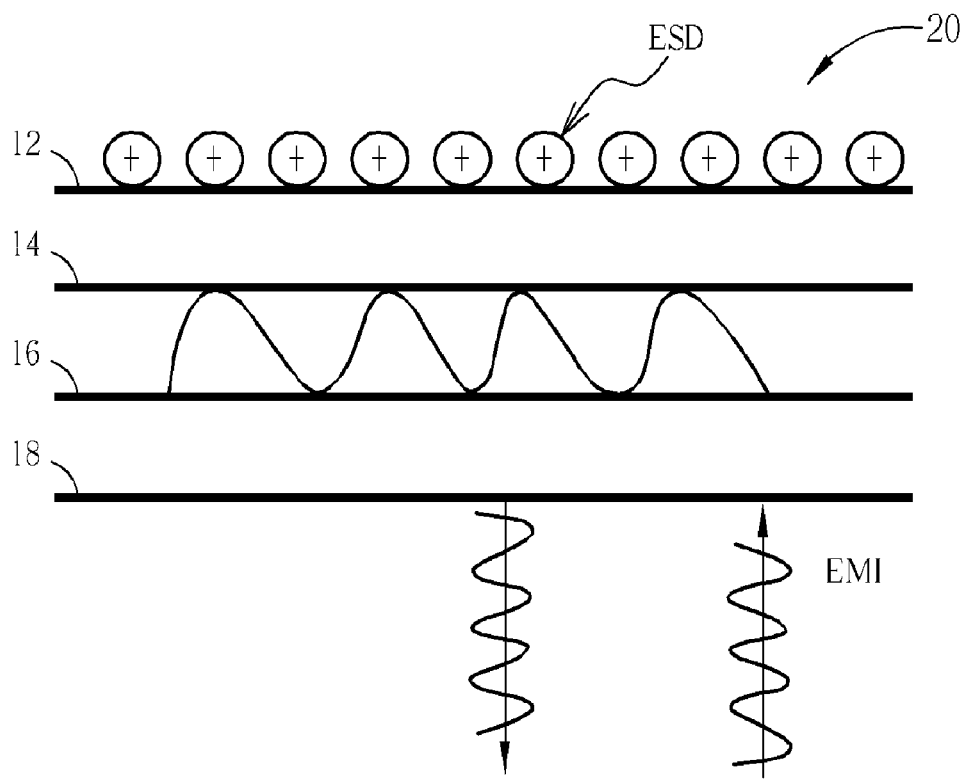
FIG. 2 shows a variation of the anti-ESD and EMI blocking shielding device illustrated in FIG. 1.

FIG. 2 shows a variation of the anti-ESD and EMI blocking shielding device illustrated in FIG. 1. According to another preferred embodiment of the present invention, a supporting layer such as PU can be laminated to the anti-ESD and EMI blocking shielding device 10. As shown in FIG. 2, an anti-ESD and EMI blocking shielding device 20 includes an anti-ESD layer 12, a conductive layer 14, an EMI blocking layer 16, and a supporting layer 18 laminated in sequence. In this way, the anti-ESD and EMI blocking shielding device 20 will be more tenacious. The supporting layer 18 can be made by any materials that can offer a supporting effect.

In addition, an anti-ESD shielding device and an EMI blocking shielding device can be made by using the fabricating method provided in the present invention.

Figure 3:
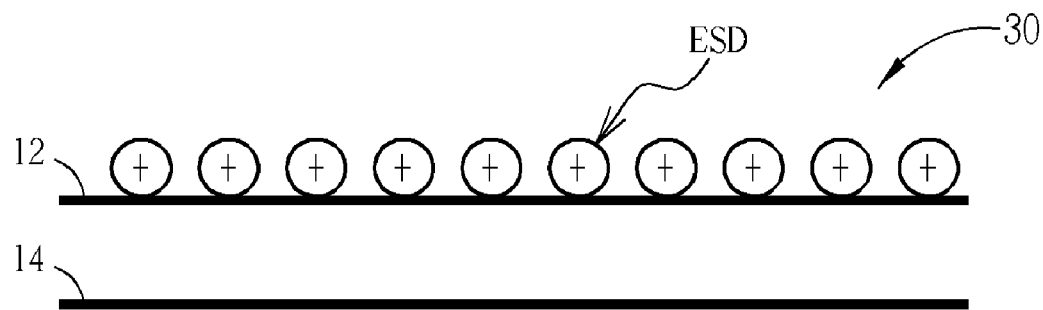
FIG. 3 shows an anti-ESD shielding device.

FIG. 3 shows an anti-ESD shielding device. An anti-ESD shielding device 30 includes an anti-ESD layer 12 and a conductive layer 14. The difference between the anti-ESD shielding device 30 and the anti-ESD and EMI blocking shielding device 10 is a supporting layer (not shown) can be laminated optionally to the bottom of the conductive layer 14.

Figure 4:
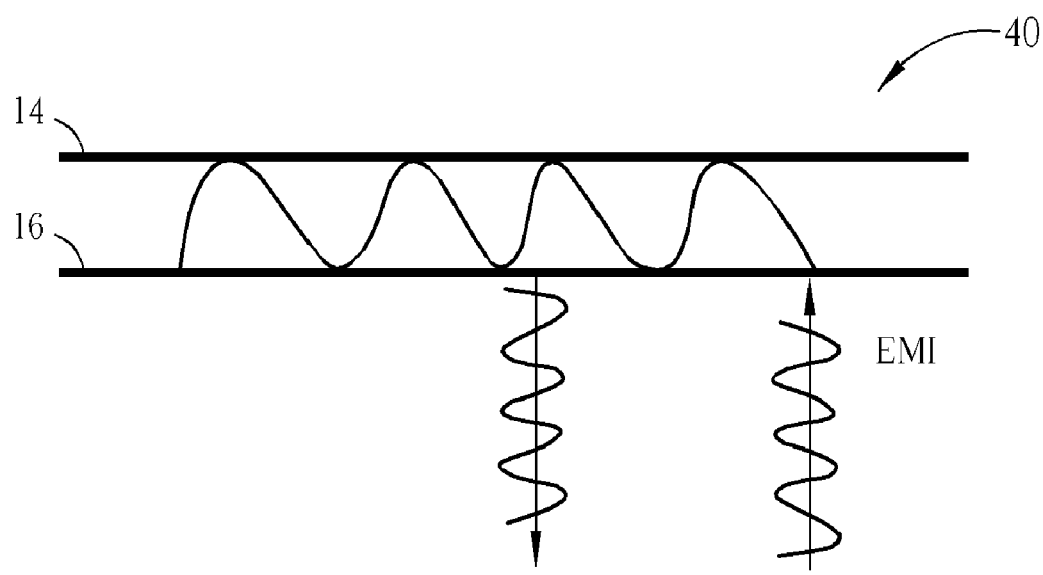
FIG. 4 shows an EMI blocking shielding device.

FIG. 4 shows an EMI blocking shielding device 40. The EMI blocking shielding device 40 includes a conductive layer 14 and an EMI blocking layer 16. The difference between the EMI blocking shielding device 40 and the anti-ESD and EMI blocking shielding device 10 is that the EMI blocking shielding device 40 does not have the anti-ESD layer 12. In addition, a supporting layer (not shown) can be laminated optionally to the bottom of the EMI blocking layer 16.

Figure 5:
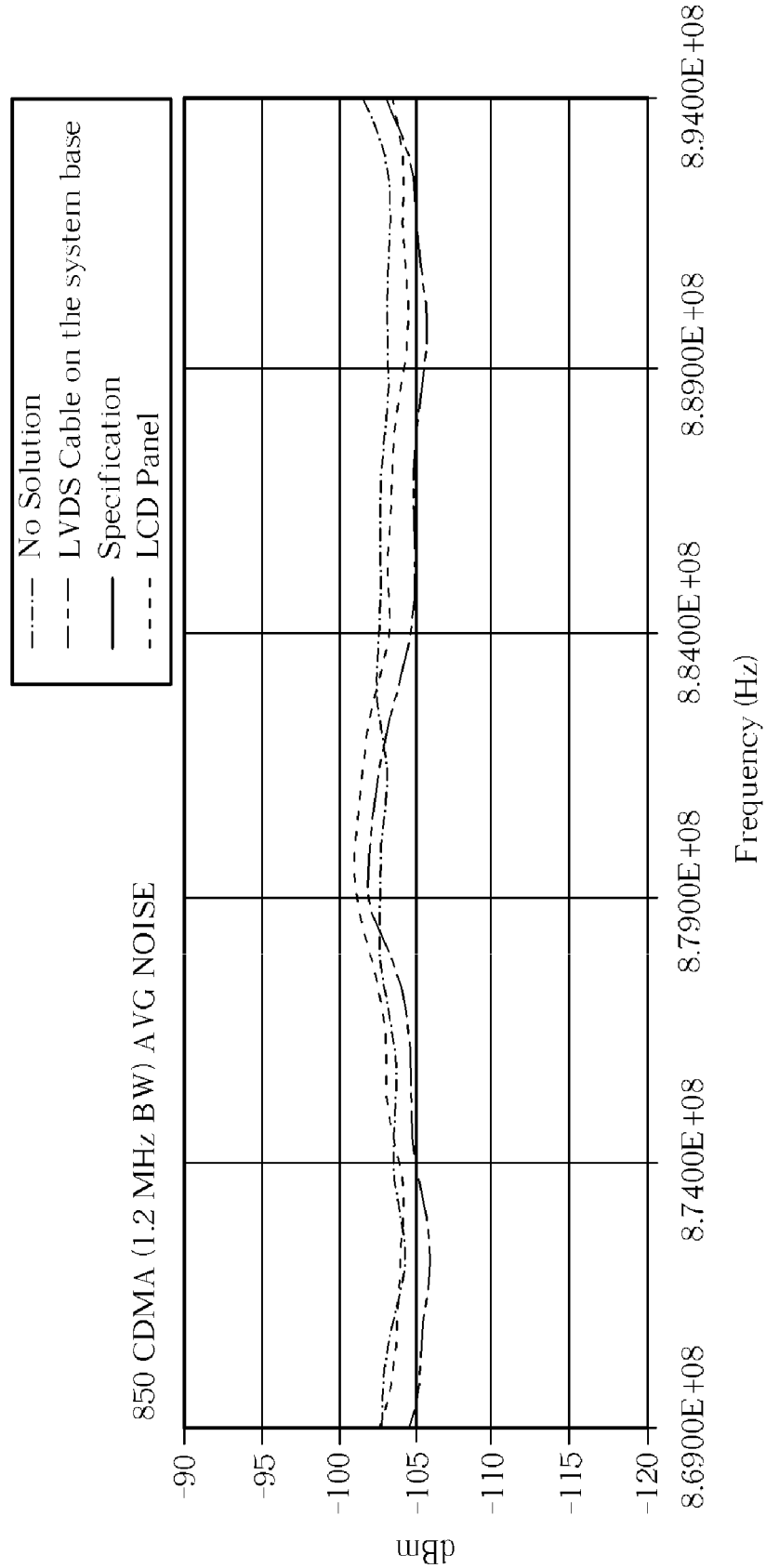
FIG. 5 shows the result of testing the EMI intensity of CDMA 850 MHz, after adhesive of the anti-ESD and EMI blocking shielding device to the noise source.

FIG. 5 shows the result of testing the EMI intensity of the Code Division Multiple Access (CDMA) 850 MHz, after adhesive of the anti-ESD and EMI blocking shielding device 10 to the noise source. The label marked "LVDS Cable on the system base" means the EMI testing result of adhesive of the anti-ESD and EMI blocking shielding device 10 to the low voltage differential signaling cable (LVDS Cable). The label marked "LCD panel" means the EMI testing result of adhesive of the anti-ESD and EMI blocking shielding device 10 to the LCD panel. The label marked "No solution" is taken as the control group. The label marked "specification" means the EMI testing result of adhesive of the anti-ESD and EMI blocking shielding device 10 to the top surface of the device under test.

Figure 6:
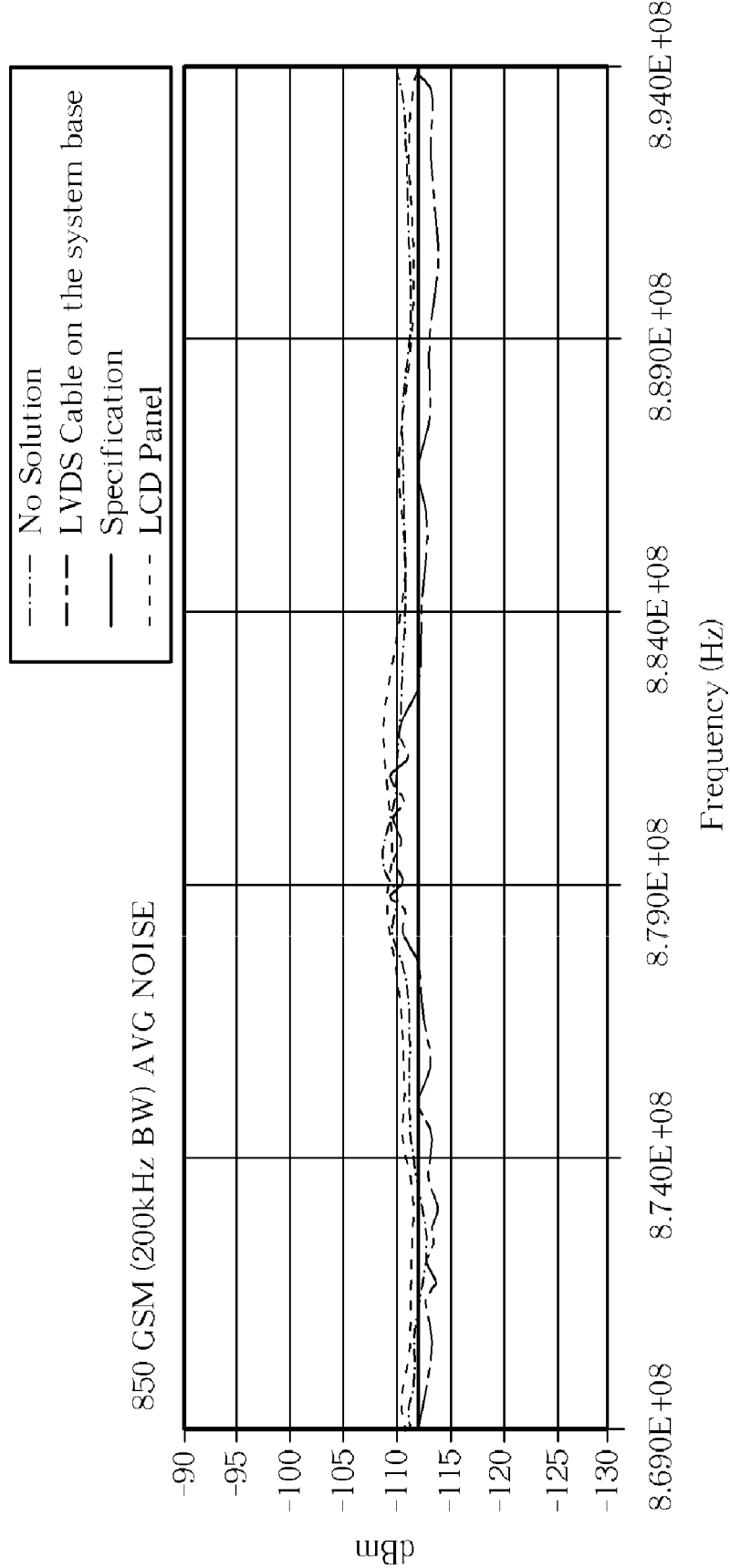
FIG. 6 shows the result of testing the EMI intensity of GSM 850 MHz, after adhesive of the anti-ESD and EMI blocking shielding device to the noise source.

FIG. 6 shows the result of testing the EMI intensity of the Global System for Mobile Communications (GSM) 850 MHz, after adhesive of the anti-ESD and EMI blocking shielding device 10 to the noise source. The meaning of the labels in FIG. 6 is the same as that in FIG. 5.

Figure 7:
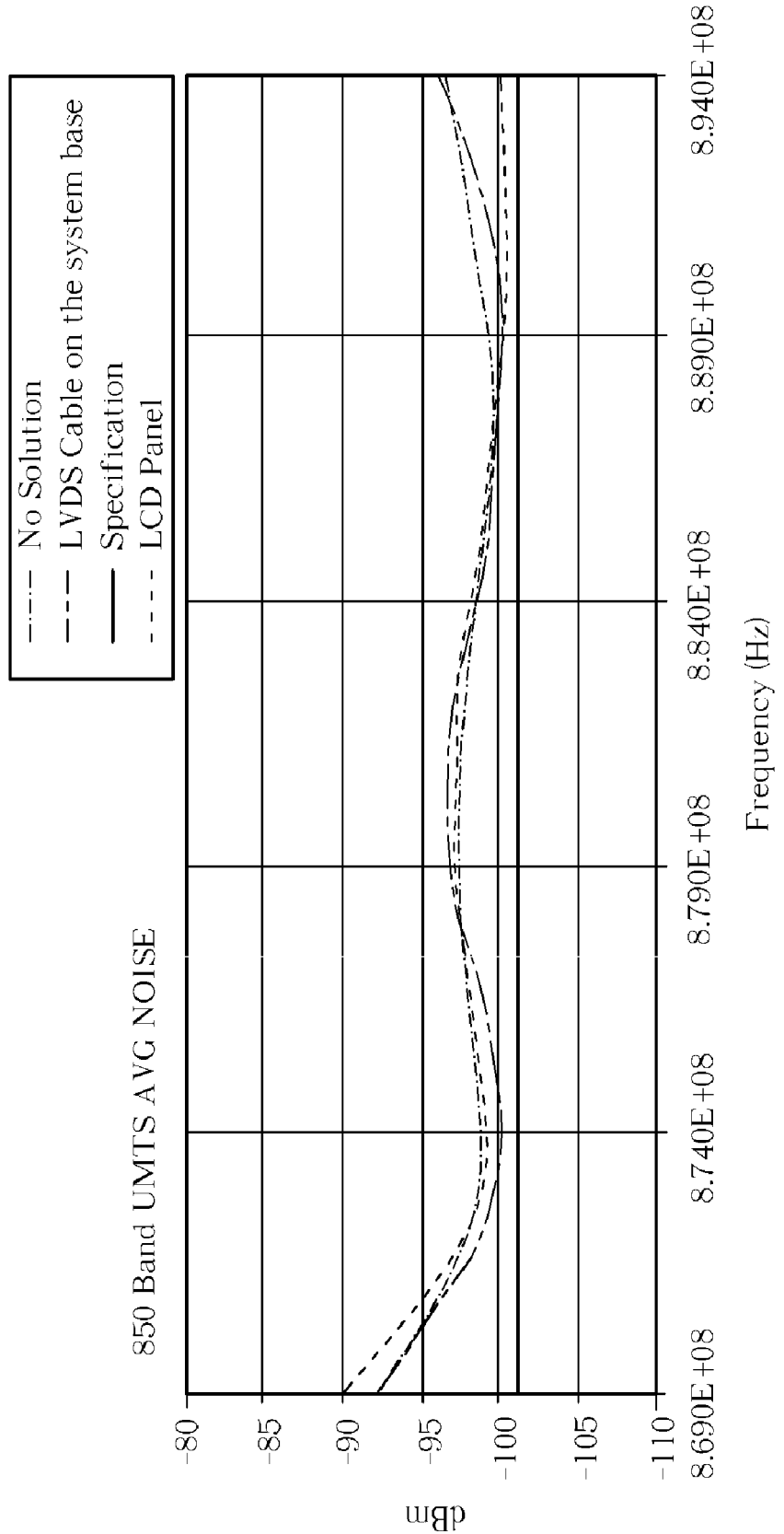
FIG. 7 shows the result of testing the EMI intensity of UMTS 850 MHz, after adhesive of the anti-ESD and EMI blocking shielding device to the noise source.

FIG. 7 shows the result of testing the EMI intensity of the Global System for Universal Mobile Telecommunication System (UMTS) 850 MHz, after adhesive of the anti-ESD and EMI blocking shielding device 10 to the noise source. The meaning of the labels in FIG. 7 is the same as that in FIG. 5.

Figure 8:
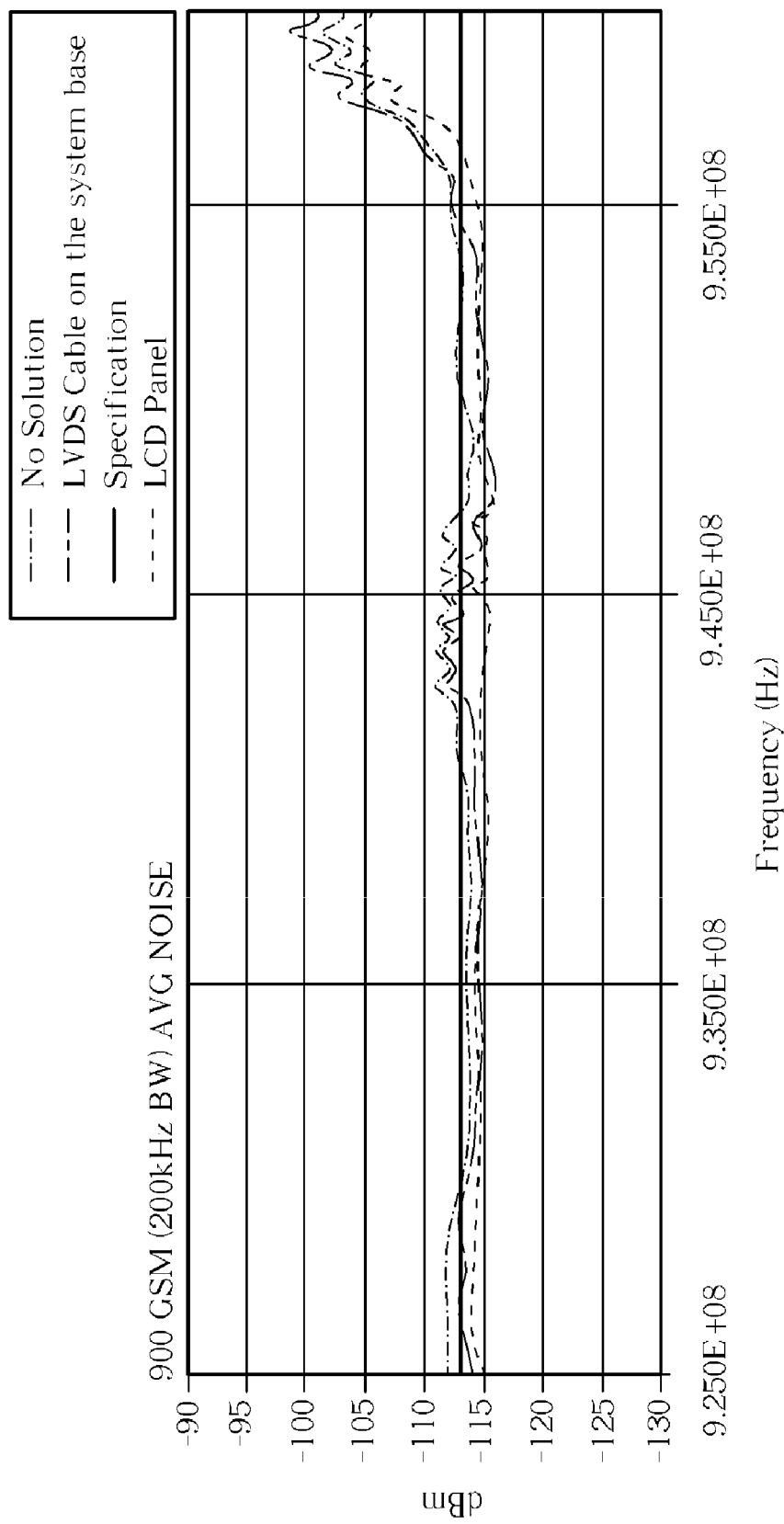
FIG. 8 shows the result of testing the EMI intensity of GSM 900 MHz, after adhesive of the anti-ESD and EMI blocking shielding device to the noise source.

FIG. 8 shows the result of testing the EMI intensity of the Global System for Mobile Communications (GSM) 900 MHz, after adhesive of the anti-ESD and EMI blocking shielding device 10 to the noise source. The meaning of the labels in FIG. 8 is the same as that in FIG. 5.

Figure 9:
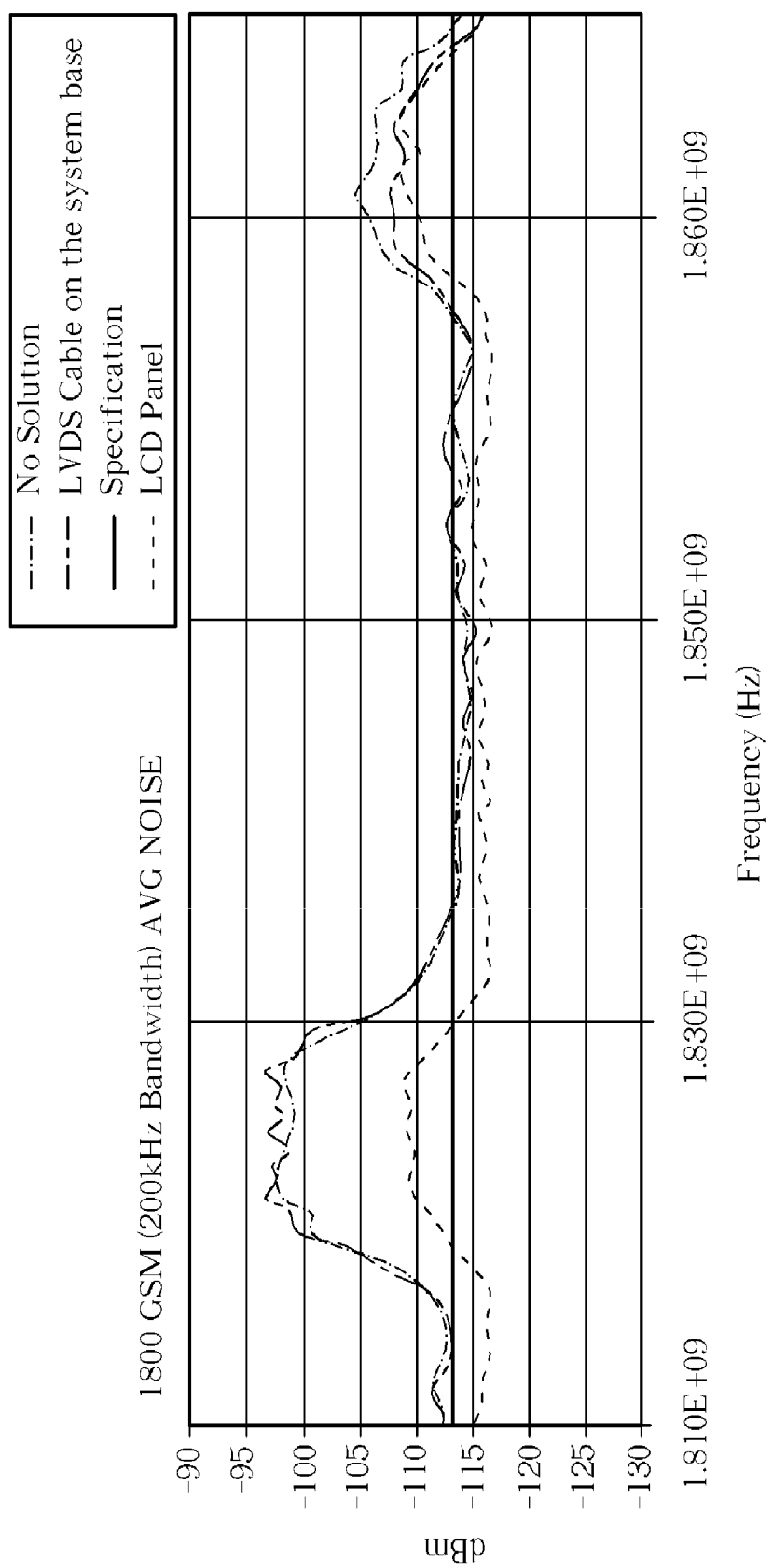
FIG. 9 shows the result of testing the EMI intensity of GSM 1800 MHz, after adhesive of the anti-ESD and EMI blocking shielding device to the noise source.

FIG. 9 shows the result of testing the EMI intensity of the Global System for Mobile Communications (GSM) 1800 MHz, after adhesive of the anti-ESD and EMI blocking shielding device 10 to the noise source. The meaning of the labels in FIG. 9 is the same as that in FIG. 5.

Figure 10:
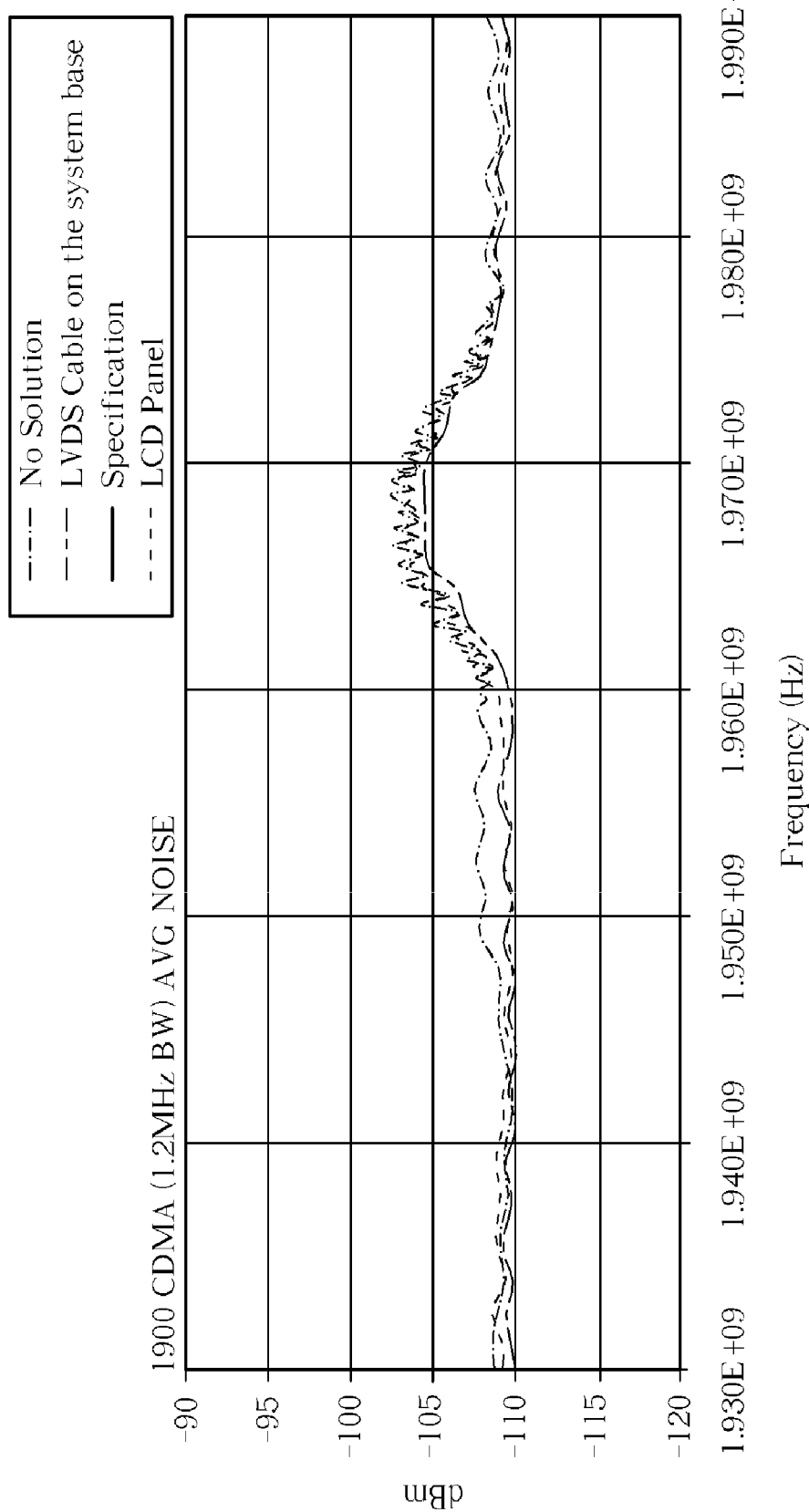
FIG. 10 shows the result of testing the EMI intensity of CDMA 1900 MHz, after adhesive of the anti-ESD and EMI blocking shielding device to the noise source.

FIG. 10 shows the result of testing the EMI intensity of the Code Division Multiple Access (CDMA) 1900 MHz, after adhesive of the anti-ESD and EMI blocking shielding device 10 to the noise source. The meaning of the labels in FIG. 10 is the same as that in FIG. 5.

Figure 11:
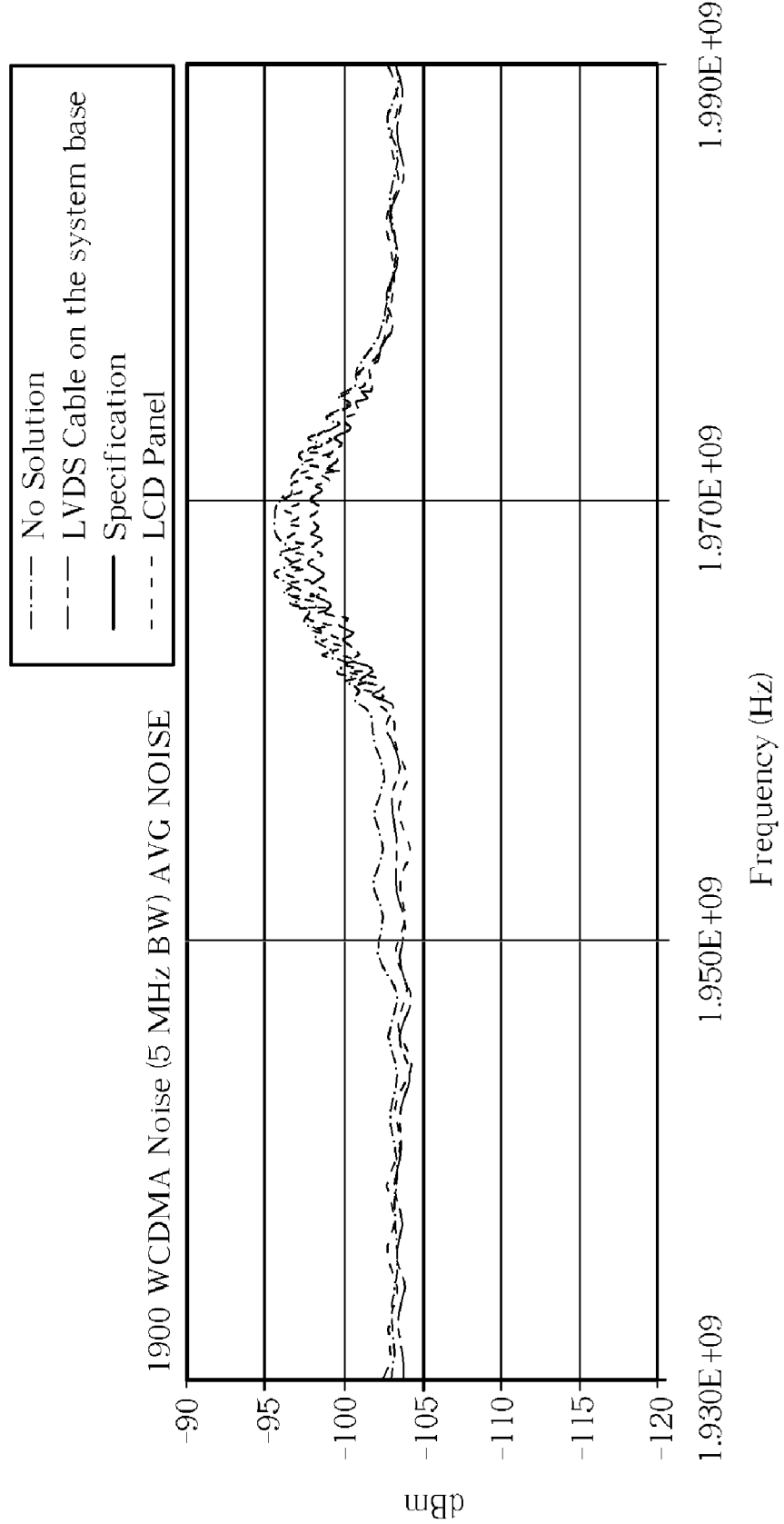
FIG. 11 shows the result of testing the EMI intensity of WCDMA 1900 MHz, after adhesive of the anti-ESD and EMI blocking shielding device to the noise source.

FIG. 11 shows the result of testing the EMI intensity of the Wideband Code Division Multiple Access (WCDMA) 1900 MHz, after adhesive of the anti-ESD and EMI blocking shielding device 10 to the noise source. The meaning of the labels in FIG. 11 is the same as that in FIG. 5.

Figure 12:
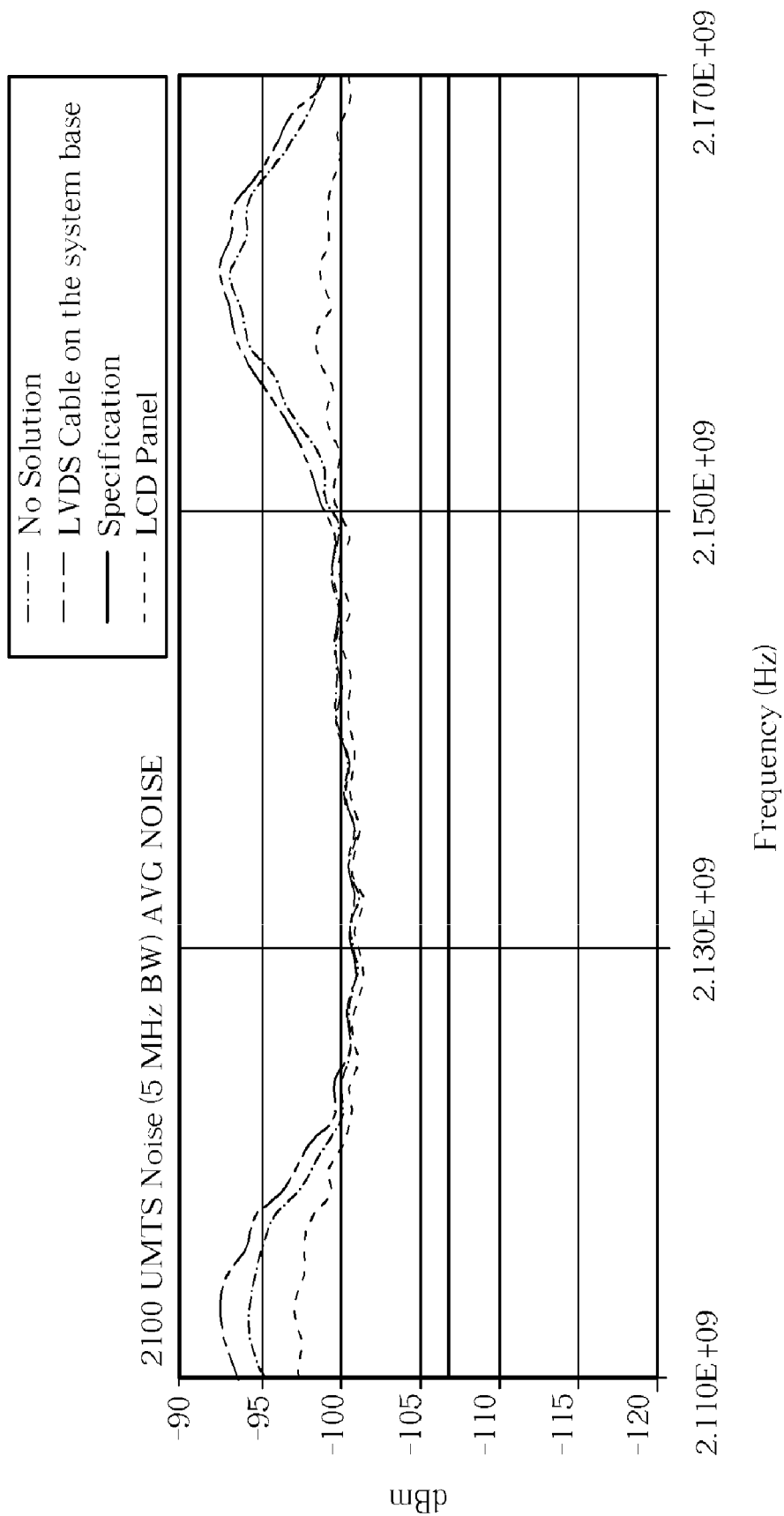
FIG. 12 shows the result of testing the EMI intensity of UMTS 2100 MHz, after adhesive of the anti-ESD and EMI blocking shielding device to the noise source.

FIG. 12 shows the result of testing the EMI intensity of the Universal Mobile Telecommunication System (UMTS) 2100 MHz, after adhesive of the anti-ESD and EMI blocking shielding device 10 to the noise source. The meaning of labels in FIG. 12 is the same as that in FIG. 5.

FIG. 5 to FIG. 12 show that the device under test adhered with the anti-ESD and EMI blocking shielding device 10 has a better EMI blocking effect than the device under test without the anti-ESD and EMI blocking shielding device 10. That is to say, the anti-ESD and EMI blocking shielding device 10 provide a good EMI blocking effect.

Those skilled in the art will readily observe that numerous modifications and alterations of the device and method may be made while retaining the teachings of the invention.

What is claimed is:

1. An EMI blocking shielding device, comprising:
 a conductive layer comprising a first conductive material, and a first shaping material; and
 an EMI blocking layer comprising a high permeability material, a second shaping material and a second conductive material, wherein the conductive layer and the EMI blocking layer are laminated to each other tightly.

2. The EMI blocking shielding device, according to claim 1, wherein the first shaping material and the second shaping material comprise polyurethane (PU), polyvinyl chloride (PVC), polystyrene (PS), polyethylene (PE), nylon or a combination thereof.

3. The EMI blocking shielding device, according to claim 1, wherein the first conductive material comprises conductive carbon black, carbon nanotubes (CNTs) or a combination thereof.

4. The EMI blocking shielding device according to claim 1, wherein the conductive layer further comprises a ferromagnetic material.

5. The EMI blocking shielding device according to claim 1, wherein the high permeability material comprises a material having a permeability greater than 1500 Wb/At·m.

6. The EMI blocking shielding device according to claim 1, wherein the second conductive material comprises copper, iron, aluminum or a combination thereof.

7. An anti-ESD and EMI blocking shielding device, comprising:
- an anti-ESD layer comprising an anti-static agent and a first shaping material;
- a conductive layer comprising a first conductive material, and a second shaping material; and
- an EMI blocking layer comprising a high permeability material, a third shaping material and a second conductive material, wherein the anti-ESD layer and the conductive layer are laminated to each other tightly and the conductive layer and the EMI blocking layer are laminated to each other tightly.

8. The anti-ESD and EMI blocking shielding device according to claim 7, wherein the first shaping material and the second shaping material comprise polyurethane (PU), polyvinyl chloride (PVC), polystyrene (PS), polyethylene (PE), nylon or a combination thereof.

9. The anti-ESD and EMI blocking shielding device according to claim 7, wherein the first conductive material comprises conductive carbon black, carbon nanotubes (CNTs) or a combination thereof.

10. The anti-ESD and EMI blocking shielding device according to claim 7, wherein the conductive layer further comprises a ferromagnetic material.

11. The anti-ESD and EMI blocking shielding device according to claim 7, wherein the high permeability material comprises a material having a permeability greater than 1500 Wb/At·m.

12. The anti-ESD and EMI blocking shielding device according to claim 7, wherein the second conductive material comprises copper, iron, aluminum or a combination thereof.

* * * * *